(12) United States Patent
Chiu et al.

(10) Patent No.: US 6,521,518 B1
(45) Date of Patent: Feb. 18, 2003

(54) METHOD OF ELIMINATING WEAKNESS CAUSED BY HIGH DENSITY PLASMA DIELECTRIC LAYER

(75) Inventors: Hung-Yu Chiu, Kaohsiung (TW); Chun-Lien Su, Tainan Hsien (TW); Wen-Pin Lu, Yilan (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/944,127

(22) Filed: Sep. 4, 2001

(51) Int. Cl.[7] .......................................... H01L 21/4763
(52) U.S. Cl. ..................... 438/585; 438/585; 438/586; 438/587; 438/588; 438/589; 438/590; 438/591; 438/592; 438/593; 438/594; 438/595; 438/596
(58) Field of Search .................................. 438/585–596

(56) References Cited

U.S. PATENT DOCUMENTS

| | | | |
|---|---|---|---|
| 5,258,333 A | * 11/1993 | Shappir et al. | 437/235 |
| 5,646,052 A | * 7/1997 | Lee | 437/67 |
| 5,731,221 A | * 3/1998 | Kwon | 437/67 |
| 6,187,648 B1 | * 2/2001 | Doi et al. | 438/424 |
| 6,200,858 B1 | * 3/2001 | Kokubu | 438/261 |
| 6,274,467 B1 | * 8/2001 | Gambino et al. | 438/563 |
| 6,344,386 B1 | * 2/2002 | Io | 438/238 |
| 6,362,094 B1 | * 3/2002 | Dabbaugh et al. | 438/637 |

* cited by examiner

*Primary Examiner*—Amir Zarabian
*Assistant Examiner*—Ida M. Soward

(57) ABSTRACT

A method of eliminating weakness caused by high-density plasma (HDP) dielectric layer is provided. Before forming the HDP dielectric layer, a hot thermal oxide (HTO) layer is previously formed on the semiconductor substrate to serve as a buffer layer. The HTO layer eliminates the defect between the HDP dielectric layer and a cap nitride layer and releases the stress therebetween, and thereby preventing bit line leakage issue.

20 Claims, 2 Drawing Sheets

METHOD OF ELIMINATING WEAKNESS CAUSED BY HIGH DENSITY PLASMA DIELECTRIC LAYER

FIELD OF THE INVENTION

The present invention relates to a method of fabricating a semiconductor memory device, and more particularly to a method of eliminating weakness caused by high-density plasma (HDP) dielectric layer.

BACKGROUND OF THE INVENTION

Memory technology has progressed considerably in recent years. Since the operational speed and the manipulation data amount of a central processing unit (CPU) is increasing, the performance of a memory cell is increasing at the same time. For example, high speed erasing is a popular method for improving the performance of a memory. Volatile storage memories, such as random access memories (RAM), are widely used in computer nowadays. However, the stored data in RAM vanishes while the power is broke off. Another nonvolatile storage memories, such as mask read only memory (Mask ROM), erasable programmable ROM (EPROM), or electrically erasable programmable ROM (EEPROM) will not lost the stored messages when power dismissed and will be better for some specific usage.

Flash memories are also a nonvolatile storage memory, which has similar structure than conventional EEPROMs. They have a very high erasing speed feature in either an overall region or a local region thereof, and therefore they are very popularly applied in the computer field. For example, they are used to replace the read-only memories to store the firmware such as BIOS (basic input/output system). The users can easily update their BIOS by rewriting the flash memory.

Conventional flash memory cells have a double or triple layer of polysilicon structure. The lower most polysilicon layer is patterned to form the floating gates, and the second polysilicon layer is patterned to form the control gates and the word lines structure. A third polysilicon layer is patterned as select gates to form the triple layer polysilicon structure.

Typically, in procedure of fabricating the flash memory cells, a silicon oxide layer, a polysilicon layer and a nitride layer are formed in sequence on a semiconductor substrate. These layers are then defined and patterned by conventional photolithography and etching technology to form a plurality of parallel stacked gate layers. A high-density plasma (HDP) oxide layer is subsequently formed to cover the stacked gate layers and fill the trenches between the stacked gate layers to server as an insulating layer. A portion of the HDP oxide layer is removed by wet etching back process until exposing the nitride layer. The exposed nitride layer is then removed by wet etching process. The word line control gates are subsequently formed in the following processes.

During producing the HDP oxide layer, since the high stress characteristic from the inherent property of the nitride layer, weakness and dislocation defect is easily formed to the HDP oxide layer, and a crack issue is readily generated between the HDP oxide layer and the nitride layer. Moreover, during the wet etching process of removing the HDP oxide layer and the nitride layer, the etchant easily encroaches the underlying polysilicon layer along the interface between the HDP oxide layer and the nitride layer, and unfortunately further encroaches the bit line region surface besides the stacked gate layer. A gap is therefore formed between the HDP oxide layer and the nitride layer. During fabricating the word line control gate in following processes, a portion of polysilicon for forming control gate is deposited into the gap, which causes a short between the floating gate and bit lines. Therefore, some coupling charges in the floating are lost form the bit lines during memory operating, so that bit line leakage issue is occurred and results in data storage failure of the memory.

SUMMARY OF THE INVENTION

The present invention provides a method of eliminating weakness caused by high-density plasma (HDP) dielectric layer. A thin hot thermal oxide (HTO) layer is formed on a semiconductor substrate before forming the HDP dielectric layer. The HTO layer can release the stress between the HDP dielectric layer and a nitride layer, and protect the sidewall of a stacked gate layer formed on the semiconductor substrate to prevent defects and gaps thereon in the subsequent etching process.

In one aspect, the present invention provides a method of eliminating weakness caused by high density plasma (HDP) dielectric layer adapted for a semiconductor substrate including a stacked gate layer of which having a silicon nitride cap layer on the top. The method comprises the following steps. A hot thermal oxide (HTO) layer covering the stacked gate layer is conformally formed over the semiconductor substrate. The HDP dielectric layer is subsequently formed on the HTO layer.

In another aspect, the present invention provides a method of fabricating a semiconductor memory device. The method at least comprises the following steps. At least one stacked gate layer is formed on a semiconductor substrate, and each stacked gate layer has a cap nitride layer on the top. Bit lines are formed in the semiconductor substrate on both sides of the stacked gate layer. A hot thermal oxide (HTO) layer covering the stacked gate layer and the bit lines is conformally formed over the semiconductor substrate. A high density plasma (HDP) dielectric layer is formed on the HTO layer.

In another aspect, the present invention also provides a method of fabricating a semiconductor memory device. The method at least comprises the following steps. A gate oxide layer, a polysilicon layer and a nitride layer are formed on a semiconductor substrate, and then patterned to form a plurality of stacked gate layers. A plurality of bit lines is formed in the semiconductor substrate on both sides of the stacked gate layers. A hot thermal oxide (HTO) layer covering the stacked gate layer and the bit lines are conformally formed over the semiconductor substrate. A high density plasma (HDP) dielectric layer is formed on the HTO layer. A portion of the HDP dielectric layer is removed until exposing the nitride layer, and then the nitride layer is removed.

The HTO layer of the present invention is formed by low pressure chemical vapor deposition (LPCVD) at a high temperature of about 600–1000 degrees, and does not consume the surface silicon layer on the semiconductor substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method of eliminating weakness cuased by high-density plasma (HDP) dielectric layer. A thin hot thermal oxide (HTO) layer is formed to cover a stacked gate layer on a semiconductor substrate before forming the HDP dielectric layer. The HTO layer can release the stress between the HDP dielectric layer and a nitride layer on the top of the stacked gate layer, and protect the sidewall of the stacked gate layer. This prevents defects and gaps formed on the sidewall of the stacked gate layer in the subsequent etching process because of encroachment from the etchant. Therefore, no bit line leakage problem is occurred in the sidewall.

Figure 1:
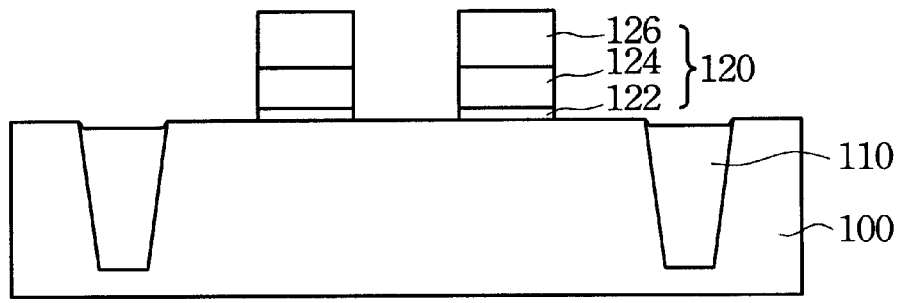
FIGS. 1A–1F are schematic cross-sectional views of the preferred embodiment of the present invention.
Figure 1:
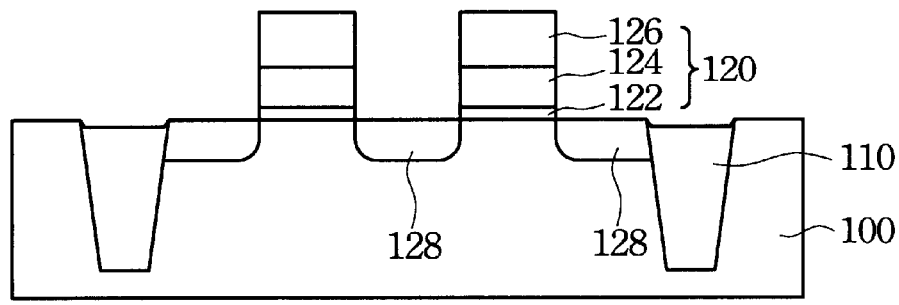
Figure 1:
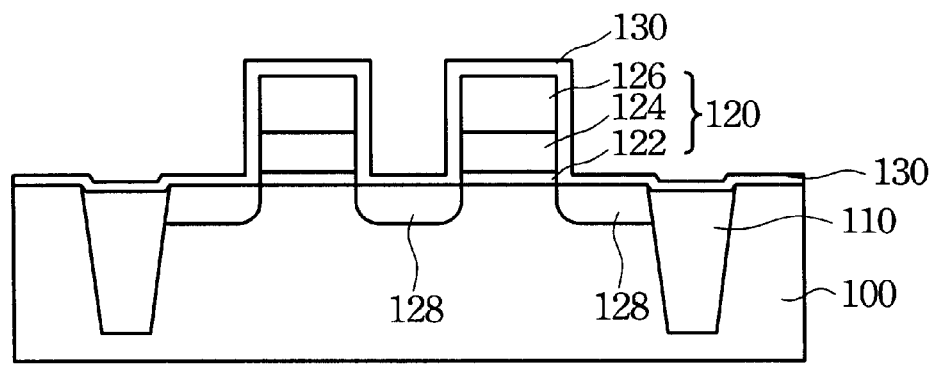

FIGS. 1A–1F are schematic, cross-sectional views of the preferred embodiment of the present invention. Referring to FIG. 1A, a semiconductor substrate 100 such as a p-type doped silicon substrate with <100> lattice structure. An isolating structure 110 is fabricated in the substrate 100 to layout the active regions for each memory cell. The isolating structure 110 can be a field oxide layer formed by LOCOS method, and preferably be a shallow trench isolation (STI) structure.

A gate oxide layer 122, a first polysilicon layer 124 and a nitride layer 126 are formed in sequence on the substrate 100. The gate oxide layer 122 can be formed by thermal oxidation technology with a thickness of about 30–150 angstroms. The first polysilicon layer 124 can be formed by low pressure chemical vapor deposition (LPCVD) at a temperature of about 600–650° C. with a thickness of about 500–1500 angstroms. The first polysilicon layer 124 also can be a doped polysilicon layer. The nitride layer 126 can be formed by CVD with a thickness of about 1100–2400 angstroms. The stacked layer that including the gate oxide layer 122, the first polysilicon layer 124 and the nitride layer 126 is then patterned by conventional photolithography and etching technology to define desired pattern. Undesired portions of the stacked layer are removed to form a plurality of linear stacked gate layers 120, as shown in FIG. 1A.

Referring to FIG. 1B, a plurality of parallel bit lines 128 are formed in the substrate 100 on both sides of the stacked gate layers 120 by ion implantation technology with the stacked gate layers 120 as a mask to dope ions into the substrate 100. The doped ions comprises p-type dopants such as B and/or $BF_2$, etc. or n-type dopants such as phosphorus (P) and/or arsenic (As), etc. Futhermore, a plasma immersion ion implantation (PIII) technology can be used to form shallow junction buried bit lines.

Referring to FIG. 1C, a thin hot thermal oxide (HTO) layer 130 covering the stacked gate layers 120 and bit lines 128 is conformally formed on the substrate 100 along the topography of the substrate 100. The HTO layer 130 of the present invention is different from the conventional thermal oxide layer formed by thermal oxidation process. The conventional thermal oxide layer formed by oxidizing the surface silicon layer of the substrate 100 must consume the silicon layer on the surface of the substrate 100, and unavoidably forms a bird's beak on the edge of the oxide layer. Especially, the bird's beak formed on the edge of the gate oxide layer 122 seriously affects the threshold voltage of the memory cells and damages the operation performance of the memory. In contrast, the HTO layer 130 of the present invention is formed by low pressure chemical vapor deposition (LPCVD) technology without the bird's beak issue in the prior art, so that the HTO layer 130 can be uniformly formed to cover the substrate 100 with preferred adhesion. The HTO layer 130 is formed at a high temperature of about 600–1000 degrees, and more preferably at a temperature of about 750–800 degrees. The HTO layer 130 can be formed from silane series precusor reacting with oxygen ($O_2$), and of course, other series precusors can be used to form the HTO layer 130. The thickness of the HTO layer 130 is about 30–200 angstroms.

Figure 1D:
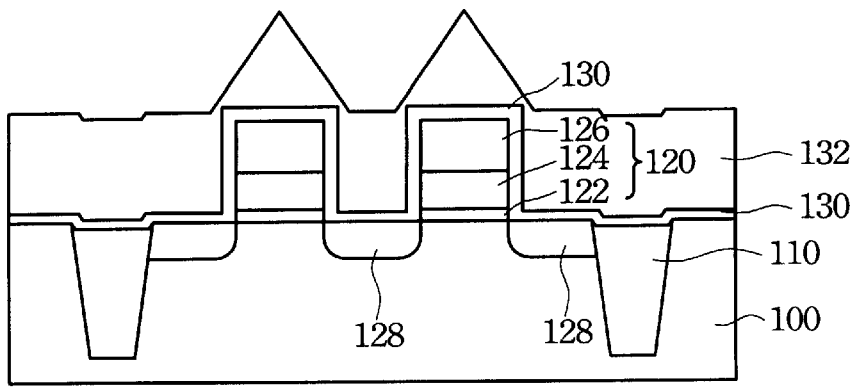

Referring to FIG. 1D, a high density plasma (HDP) dielectric layer 132 covering the whole substrate 100 is subsequently formed on the HTO layer 130 and fills into the trench between the stacked gate layers 120. The HDP dielectric layer 132 is formed by high-density plasma chemical vapor deposition (HDP-CVD) with a thickness of about 1500–3500 angstroms. The HDP dielectric layer 132 preferably is a HDP oxide layer. The nitride layer 126 on the top of the stacked gate layer 120 has high stress from its inherent property. Moreover, the HDP dielectric layer 132 has dense structure. If the HDP dielectric layer 132 is directly formed on the nitride layer 126, dislocation defect is easily formed in the interface between the nitride layer 126 and the HDP dielectric layer 132, and the high stress will results in crack issue. The HTO layer 130 of the present invention covering the top and sidewall portion of the stacked gate layer 120 is a buffer layer to release the stress between the nitride layer 126 and the HDP layer 132, thereby preventing crack problem.

Figure 1E:
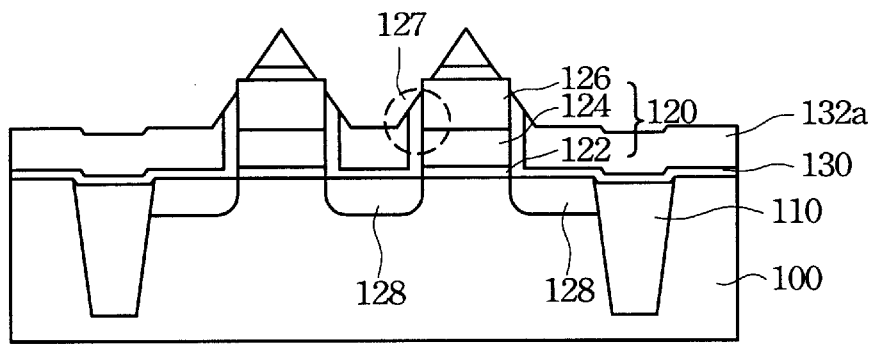

Referring to FIG. 1E, a portion of the HDP dielectric layer 132 is removed by wet etching back process under time control mode until exposing the nitride layer 126 to become a HDP dielectric layer 132a. The remaining HDP dielectric layer 132a has a thickness of about 500–2000 angstroms, which is little thicker than the polysilicon layer 124. The nitride layer 126 is following removed by wet etching technology, for example, using hydrogen fluoride (HF) solution.

Since the HTO layer 130 of the present invention is previously formed on the sidewall of the stacked gate layers 120, the sidewall can be protected by the HTO layer 130 during the wet etching process for the HDP dielectric layer 132 and the nitride layer 126. The etchant is arrested and can not encroach the sidewall area between the nitride layer 126 and the HDP dielectric layer 132a, as shown in dash circle 127, so that no defect and gap is produced thereon and the crack and bit line leakage problem can be prevented.

Figure 1F:
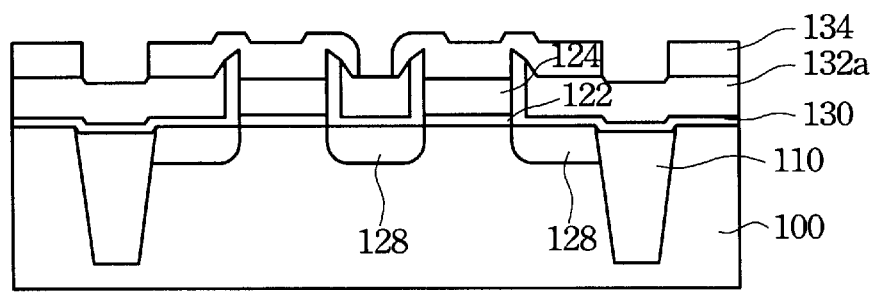

Referring to FIG. 1F, a second polysilicon layer 134 is formed on the substrate 100 and covering the whole substrate 100. A portion of the second polysilicon layer 134 is removed by conventional photolithography and etching technology to remain desired portion over the first polysilicon layer 124 and periphery HDP dielectric layer 132a. The resulting second polysilicon layer 134 extends the surface area of the first polysilicon layer 124 to increase the capacitance coupling radio between the floating gate and control gate. The HTO layer 130 of the present invention protects the sidewall of the stacked gate layer 120, and no defect and gap is produced between the nitride layer 126 and the HDP dielectric layer 132a, as shown in FIG. 1E. Therefore, no polysilicon from the polysilicon layer 134 is filled into the interface between the stacked gate layer 120 and the HDP dielectric layer 132a. Hence, no coupling charges are conducted into the bit lines 128, and no bit line leakage problem is occurred.

According to above description, the method of eliminating weakness caused by HDP dielectric layer of the present invention is provided by forming the HTO layer before the HDP dielectric layer to serve as a buffer layer. The stress between the HDP layer and the nitride layer can be released, and the sidewall of the stacked gate layer can be protected to prevent encroachment from the etchant, and thus no crack and bit line leakage problem is occurred.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of eliminating weakness caused by high density plasma (HDP) dielectric layer adapted for a semiconductor substrate including a stacked gate layer of which having a silicon nitride cap layer on the top, comprising the steps of:

conformally forming a hot thermal oxide (HTO) layer over the semiconductor substrate and covering the stacked gate layer; and forming the HDP dielectric layer on the HTO layer, wherein the HTO layer releases a stress between the silicon nitride cap layer and the HDP dielectric layer.

2. The method according to claim 1, wherein the HTO layer is formed by low pressure chemical vapor deposition (LPCVD).

3. The method according to claim 1, wherein the HPD dielectric layer completely covers the stacked gate layer.

4. The method according to claim 1, wherein the HDP dielectric layer is formed by high density plasma chemical vapor deposition (HDP-CVD).

5. The method according to claim 1, wherein the HDP dielectric layer comprises HDP oxide layer.

6. A method of fabricating a semiconductor memory device, at least comprising the steps of:

forming at least one stacked gate layer on a semiconductor substrate, and each of the stacked gate layer has a cap nitride layer on the top;

forming bit lines in the semiconductor substrate on both sides of the stacked gate layer;

conformally forming a hot thermal oxide (HTO) layer over the semiconductor substrate, and covering the stacked gate layer and the bit lines; and forming a high density plasma (HDP) dielectric layer on the HTO layer, wherein the HTO layer releases a stress between the silicon nitride cap layer and the HDP dielectric layer.

7. The method according to claim 6, wherein forming the stacked gate layer comprises the steps of:

forming a gate oxide layer, a polysilicon layer and a nitride layer sequentially on the semiconductor substrate;

forming a patterned photoresist layer on the nitride layer;

etching the nitride layer, the polysilicon layer and the gate oxide layer by using the patterned photoresist layer as a mask, and thus patterning the nitride layer, the polysilicon layer and the gate oxide layer to form the stacked gate layer.

8. The method according to claim 6, wherein the method of forming the bit lines comprises ion implantation.

9. The method according to claim 6, wherein the HTO layer is formed by low pressure chemical vapor deposition (LPCVD).

10. The method according to claim 9, wherein the HTO layer is formed at a temperature of about 600–1000 degrees.

11. The method according to claim 6, wherein the HDP dielectric layer is formed by high density plasma chemical vapor deposition (HDP-CVD).

12. The method according to claim 6, wherein the HDP dielectric layer comprises HDP oxide layer.

13. A method of fabricating a semiconductor memory device, at least comprising the steps of:

forming a gate oxide layer, a polysilicon layer and a nitride layer sequentially on a semiconductor substrate;

patterning the nitride layer, the polysilicon layer and the gate oxide layer to form a plurality of stacked gate layers;

forming a plurality of bit lines in the semiconductor substrate on both sides of the stacked gate layers;

conformally forming a hot thermal oxide (HTO) layer over the semiconductor substrate, and covering the stacked gate layer and the bit lines;

forming a high density plasma (HDP) oxide layer on the HTO layer, wherein the HTO layer releases a stress between the silicon nitride cap layer and the HDP dielectric layer;

removing a portion of the HDP oxide layer until exposing the nitride layer; and removing the nitride layer.

14. The method according to claim 13, wherein patterning the nitride layer, the polysilicon layer and the gate oxide layer comprises the steps of:

forming a photoresist layer on the nitride layer;

removing a portion of the photoresist layer by photolithography technology to form desired pattern onto the photoresist layer;

etching the nitride layer, the polysilicon layer and the gate oxide layer by using the patterned photoresist layer as a mask, and thus patterning the nitride layer, the polysilicon layer and the gate oxide layer to form the stacked gate layers.

15. The method according to claim 13, wherein the method of forming the bit lines comprises ion implantation.

16. The method according to claim 13, wherein the HTO layer is formed by low pressure chemical vapor deposition (LPCVD).

17. The method according to claim 16, wherein the HTO layer is formed at a temperature of about 600–1000 degrees.

18. The method according to claim 13, wherein the HDP oxide layer is formed by high density plasma chemical vapor deposition (HDP-CVD).

19. The method according to claim 13, wherein the method of removing the HDP oxide layer comprises wet etching back process.

20. The method according to claim 13, wherein the method of removing the nitride layer comprises wet etching process.

* * * * *